United States Patent
Duerinckx

(10) Patent No.: US 12,031,670 B2
(45) Date of Patent: Jul. 9, 2024

(54) LUBRICANT DISPENSER SYSTEMS AND METHODS

(71) Applicant: GRIZIT B.V., Merchtem (BE)

(72) Inventor: David Duerinckx, Hoegaarden (BE)

(73) Assignee: GRIZIT B.V., Merchtem (BE)

( * ) Notice: Subject to any disclaimer, the term of this patent is extended or adjusted under 35 U.S.C. 154(b) by 10 days.

(21) Appl. No.: 17/802,278

(22) PCT Filed: Feb. 25, 2021

(86) PCT No.: PCT/EP2021/054765
§ 371 (c)(1),
(2) Date: Aug. 25, 2022

(87) PCT Pub. No.: WO2021/170764
PCT Pub. Date: Sep. 2, 2021

(65) Prior Publication Data
US 2023/0142640 A1    May 11, 2023

(30) Foreign Application Priority Data
Feb. 25, 2020   (EP) ..................................... 20159395

(51) Int. Cl.
*F16N 21/02* (2006.01)
*F16N 5/02* (2006.01)
(Continued)

(52) U.S. Cl.
CPC .............. *F16N 21/02* (2013.01); *F16N 5/02* (2013.01); *F16N 21/04* (2013.01); *F16N 29/02* (2013.01);
(Continued)

(58) Field of Classification Search
CPC . F16N 21/02; F16N 5/02; F16N 21/04; F16N 20/02; F16N 3/10; F16N 2230/02; F16N 2200/00; F16N 3/12; F16N 2230/00
See application file for complete search history.

(56) References Cited

U.S. PATENT DOCUMENTS

| 1,697,217 A * | 1/1929 | Zerk ....................... F16N 21/04 |
| | | 184/105.3 |
| 5,350,040 A * | 9/1994 | Gribble ................... F16N 29/00 |
| | | 184/105.3 |

(Continued)

FOREIGN PATENT DOCUMENTS

| EP | 1192387 A1 | 4/2002 |
| WO | 2010026559 A1 | 3/2010 |

(Continued)

OTHER PUBLICATIONS

Extended Search Report from corresponding European Patent Application No. EP20159395.1, dated Sep. 3, 2020.

(Continued)

*Primary Examiner* — Michael A Riegelman
(74) *Attorney, Agent, or Firm* — Workman Nydegger

(57) ABSTRACT

A fitting for a lubrication point of a device to be lubricated and a connector for removably connecting to such fitting to provide a lubricant from a lubrication device via the fitting to the device to be lubricated are disclosed. The fitting comprises an integrated circuit for providing an identification code to identify the fitting, and a first electrical contact for establishing an electrical path between the integrated circuit and a processor of the connector when a connection between the fitting and the connector is established. The connector comprises the processor and a second electrical contact for establishing the electrical path. The integrated circuit is adapted for transmitting data, including the iden- (Continued)

tification code, via the first electrical contact to the processor.

19 Claims, 6 Drawing Sheets

(51) Int. Cl.
    *F16N 21/04*     (2006.01)
    *F16N 29/02*     (2006.01)
    *F16N 29/04*     (2006.01)
    *H05K 1/18*     (2006.01)
    *F16N 3/10*     (2006.01)

(52) U.S. Cl.
    CPC ............. *F16N 29/04* (2013.01); *H05K 1/181* (2013.01); *F16N 3/10* (2013.01); *F16N 2200/00* (2013.01); *F16N 2230/02* (2013.01); *F16N 2250/40* (2013.01); *F16N 2260/02* (2013.01); *F16N 2270/20* (2013.01)

(56) References Cited

U.S. PATENT DOCUMENTS

| | | | | |
|---|---|---|---|---|
| 6,101,427 | A * | 8/2000 | Yang | F16N 29/02 |
| | | | | 700/239 |
| 6,236,328 | B1 * | 5/2001 | Smith | F16C 19/525 |
| | | | | 340/682 |
| 6,271,761 | B1 * | 8/2001 | Smith | F16C 33/6622 |
| | | | | 340/682 |
| 6,997,286 | B1 * | 2/2006 | Funck | F16N 29/02 |
| | | | | 222/14 |
| 8,746,068 | B2 * | 6/2014 | Goodman | G01M 3/24 |
| | | | | 118/679 |
| 11,199,293 | B2 * | 12/2021 | Gibson | F16N 29/02 |
| 2004/0211470 | A1 * | 10/2004 | Apostolides | F01M 11/0458 |
| | | | | 137/565.11 |
| 2004/0231927 | A1 * | 11/2004 | Huang | F16N 11/08 |
| | | | | 184/105.2 |
| 2005/0173004 | A1 * | 8/2005 | Apostolides | F01M 11/0408 |
| | | | | 137/512 |
| 2007/0137942 | A1 * | 6/2007 | Weems | F16N 5/02 |
| | | | | 184/105.2 |
| 2013/0081903 | A1 * | 4/2013 | Alekseyev | H02P 7/08 |
| | | | | 184/26 |
| 2014/0202554 | A1 * | 7/2014 | Apostolides | B08B 9/032 |
| | | | | 137/15.04 |
| 2014/0290761 | A1 * | 10/2014 | Apostolides | F01M 11/0408 |
| | | | | 137/511 |
| 2017/0089236 | A1 * | 3/2017 | Andersen | F01M 11/10 |
| 2019/0040998 | A1 * | 2/2019 | Wride | F16N 29/04 |
| 2019/0107249 | A1 * | 4/2019 | Jolic | F16N 21/00 |
| 2021/0190265 | A1 * | 6/2021 | David | F16N 11/08 |
| 2022/0412912 | A1 * | 12/2022 | Zambon | G01N 27/221 |
| 2023/0142640 | A1 * | 5/2023 | Duerinckx | F16N 29/02 |
| | | | | 184/105.3 |

FOREIGN PATENT DOCUMENTS

WO         2013135742 A1     9/2013
WO    WO-2020221666 A1 * 11/2020 ............. F16N 21/02

OTHER PUBLICATIONS

International Search Report from corresponding PCT Application No. PCT/EP2021/054765, dated May 10, 2021.

* cited by examiner

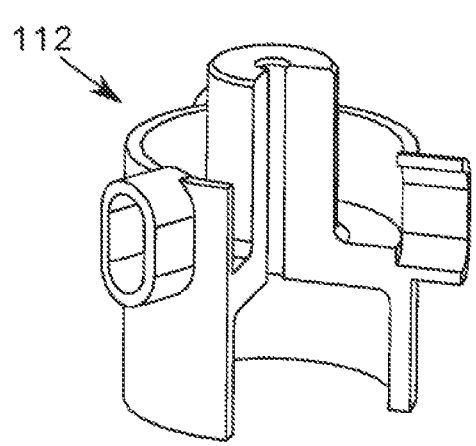
FIG 12
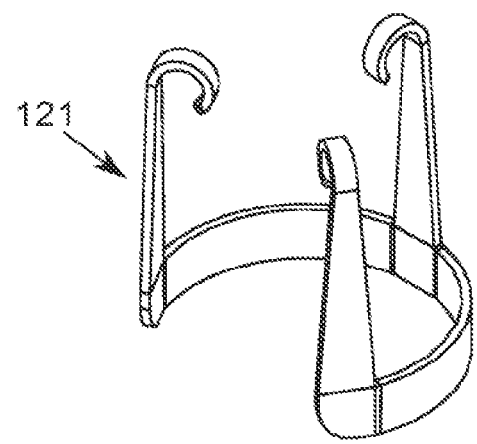
FIG 13
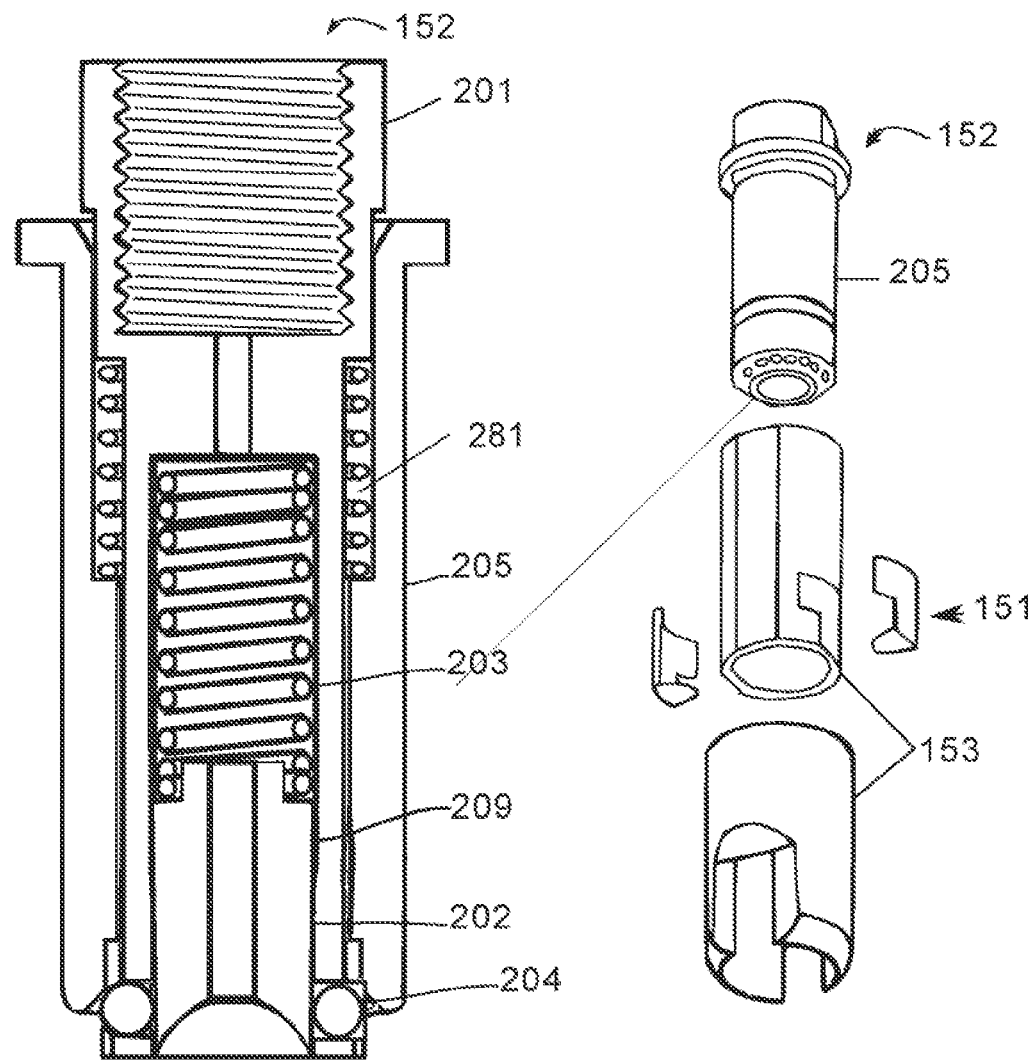
FIG 14
FIG 15

LUBRICANT DISPENSER SYSTEMS AND METHODS

TECHNICAL FIELD

The present invention relates to the field of lubricant dispensers for lubrication of machines, vehicles, industrial assembly lines and the like. The present invention specifically relates to a fitting of a lubrication point, e.g. a grease nipple, a printed circuit board element, a connector for a lubricant dispenser, e.g. a grease head of a grease gun, a lubricant dispenser system and a related method.

BACKGROUND ART

Many, even most, of the moving parts in machines require lubrication. Lubricant dispenser systems are well-known in the art, which dispense a lubricant, such as grease, to a lubrication point of a machine. In a typical industrial plant, the number of lubrication points can easily exceed one thousand.

For example, bearings need to be frequently lubricated to ensure smooth operation during their entire intended lifetime. Almost two-thirds of bearing failures can be attributed to insufficient lubrication. Under humid conditions, ungreased bearings break down rapidly, e.g. due to oxidation and the ensuing loss of structural integrity. Even under dry conditions, insufficient lubrication can cause wear or even mechanical deformation of the moving machine parts, and thus may require premature repair or replacement. The costs due to insufficient greasing are not limited to the, often substantial, repair and maintenance costs, but also include the opportunity cost implied by downtime. Furthermore, excessive lubrication is also to be avoided, since this can lead to overheating, and hence potentially to damage of the components. Another undesirable effect of too much lubricant is unnecessary waste and/or pollution.

A lubricant source, e.g. a container or liquid conduit, is typically removably connected to the lubrication point at the machine to be lubricated. Often, the lubrication is performed manually, by sequentially servicing a plurality of such lubrication points. A dispensing mechanism, e.g. a grease gun, used in such manual lubrication process typically comprises an actuated (e.g. manually, pneumatically or electrically driven) plunger that pressurizes the lubricant to dispense the lubricant from an outlet, e.g. a grease head of the grease gun, when needed, i.e. when connected to the lubrication point.

Automatic systems are also known in the art, in which a controller steers the dispensing mechanism, for example by activating the plunger when an external signal is received or when a timer interval lapses. The controller may also determine, in addition to a timing of the lubrication, an amount of lubricant to dispense, and may also comprise status and/or error reporting means, such as indicator lights.

In lubricant dispenser systems where a lubricant source is removably attached to the lubrication point, such as manually serviced lubrication points and/or lubrication points that are serviced by a robotic system, i.e. particularly as opposed to being permanently connected to a conduit for providing the lubricant, the lubrication point typically comprises a grease nipple, which can be connected to a complementary grease head, e.g. of a grease gun. The grease nipple, also referred to as grease fitting or Zerk fitting, is a fitting that is specifically designed to feed the lubricant, e.g. lubricating grease, under pressure into a machine to be lubricated, e.g. typically into a bearing. The basic structure of these fittings is described in detail in, for example, U.S. Pat. No. 1,697,217. The fitting is typically permanently fixed (or at least fixed without the intention to be removed) to the lubrication point of the machine, e.g. to the bearing. The fitting may be fastened by a screw thread. Various common sizes exist, amongst which screw nipples in accordance with the DIN 71412 norm, having an M8 screw thread.

When a grease gun is connected to the fitting and pressure is applied, a small ball check valve, e.g. comprising a small captive bearing ball in the fitting, is pushed open when the force of a retaining mechanism, e.g. a retaining spring, is overcome by the pressure. Thus, the lubricant is held in the bearing by this check valve mechanism.

Grease nipples commonly have a distinct convex shape, which allows a complementary concave tip of the grease gun to seal against the fitting easily. The shape allows some tolerance in the contact angle, such that a connection between the grease gun and the grease nipple can be established quickly and efficiently, while still ensuring a sufficiently tight sealing (i.e. temporary sealing, during the lubrication operation) between these elements.

However, the lubrication process is prone to errors, particularly if performed manually. Lubrication points can be mistakenly skipped, or an incorrect amount of lubricant, i.e. too much or too little, can be applied. This risk is particularly exacerbated in a setting where each lubrication point may have its own distinct optimal range of lubricant to be applied and/or its own distinct optimal frequency of lubrication. As already mentioned hereinabove, the undesirable effects of applying too little or too much lubricant, or too often or not often enough, can be severe.

The international patent application WO 2010/026559 discloses a lubricator device for dispensing a lubricant to a lubrication point of a machine. A control circuit of the device comprises a memory for storing an ID code and a radiofrequency (RF) transceiver, e.g. a radio frequency identification (RFID) module. The control circuit may be programmed by received control signals, e.g. to schedule lubrication events. The control circuit may transmit an operational parameter, such as an error condition, in combination with the ID code.

Thus, a plurality of lubricator devices can be provided on a site, e.g. a plant, and controlled and monitored by a computer. Relay stations may be used to act as local gateways between the RF signal communication and a telecommunication network suitable for longer range and/or higher bandwidth communication.

SUMMARY OF THE INVENTION

It is an objective of the present invention to provide good, efficient, simple and/or compact means and methods for lubrication of moving parts, such as bearings, of machines, vehicles and the like.

It is an advantage of embodiments of the present invention that a good and reliable mechanical contact can be established between a fitting for a lubrication point, e.g. a grease nipple, and a connector of a lubrication device, e.g. a grease head of a grease gun, e.g. such that a lubricant can be safely transferred without spilling and without risking contamination by dirt.

It is an advantage of embodiments of the present invention that a good and reliable electrical contact can be established between a fitting for a lubrication point, e.g. a grease nipple, and a connector of a lubrication device, e.g. a grease head of a grease gun, to communicate a signal representative of an identification code of the lubrication point.

It is an advantage of embodiments of the present invention that a good electrical isolation between two conductive contacts is provided, in which these conductive contacts are used to communicate a signal between the fitting for the lubrication point and the connector of the lubrication device.

It is an advantage of embodiments of the present invention that a fitting for a lubrication point, e.g. a grease nipple, is provided that can be implemented such as to have a diameter of less than 25 mm, preferably in the range of 10 mm to 23 mm, e.g. in the range of 13 mm to 17 mm, e.g. 15 mm. It is an advantage of embodiments of the present invention that a fitting for a lubrication point, e.g. a grease nipple, is provided that can be implemented such as to have a height of less than 10 mm, preferably in the range of 3 mm to 8 mm, e.g. in the range of 5 mm to 7 mm, e.g. 5 mm, 6 mm or 7 mm. It is a further advantage that these diameter and height dimensions, which can be achieved in accordance with embodiments of the present invention, may be compatible with typical and/or standardized dimensions allotted for building in grease nipples in bearings and industrial machines. Typically, a space for building in a grease nipple of less than 25 mm may be accounted for in industrial designs, and a height of up to 7 mm can be accommodated.

It is an advantage of embodiments of the present invention that a fitting for a lubrication point and a connector for a lubrication device are provided that can be easily and cheaply manufactured.

It is an advantage of embodiments of the present invention that a fitting for a lubrication point and a connector for a lubrication device are provided that are suitable for operating conditions in industrial environments, e.g. a temperature range of −20° C. to 140° C., and a lubricant pressure of 400 bar, preferably even a lubricant pressure of up to 700 bar. Preferably, the devices in accordance with embodiments of the present invention are also suitable for use in humid conditions. Particularly, it is an advantage of embodiments of the present invention that a fitting for a lubrication point and a connector for a lubrication device are provided that are corrosion resistant.

It is an advantage of embodiments of the present invention that a good electrical and mechanical contact can be established between the fitting for a lubrication point and the connector for a lubrication device that is not affected by, e.g. that is not disrupted by, dust, grease, sand, moisture and/or other pollutants that may be present in the environment.

It is an advantage of embodiments of the present invention that a good durability can be achieved. For example, the fitting for the lubrication point may be suitable for at least 5000 lubrication events during its lifetime, and the connector for the lubrication device may be suitable for at least 100000 lubrication events during its lifetime.

It is an advantage of embodiments of the present invention that conventional methods for lubricating devices are not disrupted, i.e. remain unchanged or minimally changed, when using a fitting and connector in accordance with embodiments. For example, the steps of cleaning the grease nipple with a cloth, connecting the grease head to the grease nipple, operating the grease gun and removing the grease head from the grease nipple when the correct amount of lubricant is provided to the machine being serviced are substantially the same when using a fitting and connector in accordance with embodiments as when using a conventional grease nipple and grease head. It is an advantage that the fitting and the connector in accordance with embodiments can be easily, and in a user-friendly manner, connected to each other and disconnected from each other.

In a first aspect, the present invention relates to a fitting for a lubrication point of a device to be lubricated, said fitting being adapted for removably connecting to a connector in accordance with embodiments of the second aspect of the present invention to receive a lubricant from the connector. The fitting comprises a body in which a fluid conduit is formed for guiding a lubricant, when received from the connector via an inlet of the fluid conduit, into the lubrication point, an integrated circuit adapted for providing an identification code to identify the fitting, and a first electrical contact for establishing an electrical path between the integrated circuit and the processor of the connector when a connection between the fitting and the connector is established.

The body comprises a fixation end for fastening the fitting into or onto the lubrication point. The integrated circuit is adapted for transmitting data via the first electrical contact to said processor, when a connection between the fitting and the connector is established, in which the data comprises said identification code.

In a fitting in accordance with embodiments of the present invention, the integrated circuit may comprise an electronic memory for storing said identification code.

In a fitting in accordance with embodiments of the present invention, the integrated circuit may be adapted for generating said identification code in response to a challenge message received from the processor via said first electrical contact, when a connection between the fitting and the connector is established. The generated identification code may be dependent on the received challenge message and the identification code in combination with the challenge message may allow the fitting to be uniquely identified by the processor.

In a fitting in accordance with embodiments of the present invention, establishing the electrical path may cause a power supply of said connector to be made available to the integrated circuit via the electrical path. In other words, the first electrical contact and the integrated circuit may be adapted for receiving a power supply, e.g. to power the integrated circuit, via the electrical path.

In a fitting in accordance with embodiments of the present invention, the first electrical contact may comprise at least two separate electrical conductors for connecting respectively, by contact, to at least two separate electrical conductors of the connector in order to establish said electrical path, each of said at least two separate electrical conductors of the fitting, separately, being operably connected to the integrated circuit.

In a fitting in accordance with embodiments of the present invention, at least a part of the body may be composed of a conductive material and may form (at least) one of said at least two separate electrical conductors of the fitting.

A fitting in accordance with embodiments of the present invention may comprise a contact element that is fitted around a neck section of the body, in which at least one of said at least two separate electrical conductors is comprised in said contact element.

A fitting in accordance with embodiments of the present invention may comprise a printed circuit board, the contact element being comprised in the printed circuit board, and the integrated circuit being integrated in or mounted onto the printed circuit board.

In a fitting in accordance with embodiments of the present invention, the integrated circuit may comprise a sensor for determining a property of the lubricant in said fitting or in said device to be lubricated and/or of the device to be lubricated, when said fitting is installed in or on said lubrication point. The integrated circuit may be adapted for communicating said determined property to said processor of said connector when a connection between the fitting (1) and the connector (10) is established.

In a fitting in accordance with embodiments of the present invention, a part of said body may be shaped as a bolt to aid in fastening said fitting into or onto the lubrication point.

A fitting in accordance with embodiments of the present invention may comprise a check valve in said fluid conduit.

In a second aspect, the present invention relates to a connector adapted for removably connecting to a fitting in accordance with embodiments of the first aspect of the present invention to provide a lubricant from a lubrication device, when the lubrication device is operably attached to the connector, to the fitting when connected to the connector. The connector comprises a processor for receiving an identification code from the integrated circuit of the fitting when connected thereto, and a second electrical contact for establishing an electrical path between the integrated circuit of the fitting and the processor via the first electrical contact of the fitting when a connection between the fitting and the connector is established.

In a connector in accordance with embodiments of the present invention, the processor may comprise an electronic memory for storing said received identification code, or an identification of said fitting based on said received identification code, optionally together with a timestamp to indicate when said fitting was mechanically and electrically coupled to the connector and/or together with further data received from a sensor in said fitting or in said connector.

In a connector in accordance with embodiments of the present invention, the processor may be adapted for storing failed connection attempts in said memory, optionally together with a timestamp to indicate when said failed connection attempt took place.

A connector in accordance with embodiments of the present invention may comprise a communication module for sending information to a computer (e.g. a server), and/or a display for displaying information to a user, and/or an alert generator for alerting a user in response to information, in which the information comprises data that is determined by the processor on the basis of the identification of the fitting.

A connector in accordance with embodiments of the present invention may comprise a metering device for automatically dispensing an amount of lubricant into the fitting, in which the amount of lubricant is determined by the processor taking the identification of the fitting into account, and/or in which the metering device is adapted for measuring the amount of lubricant that is manually released by an operator of the connector into the fitting and providing the measured amount to the processor.

In a third aspect, the present invention relates to a printed circuit board device comprising a printed circuit board adapted for attaching to a fitting, e.g. a prior-art fitting, which is installed or is suitable for installing in or on a lubrication point of a device to be lubricated, such that the printed circuit board device, when installed in or onto the fitting forms a fitting in accordance with embodiments of the first aspect of the present invention.

In a fourth aspect, the present invention relates to a lubrication device comprising a connector in accordance with embodiments of the second aspect of the present invention, the connector being operably attached to or integrated in the lubrication device.

In a fifth aspect, the present invention relates to a lubricant dispenser system (e.g. a kit of parts) comprising at least one lubrication device in accordance with embodiments of the fourth aspect of the present invention and at least one fitting in accordance with embodiments of the first aspect of the present invention.

The present invention relates in a sixth aspect to a method for servicing a lubrication point of a device to be lubricated, in which a fitting is fastened to the lubrication point. The method comprises obtaining a lubrication device to provide a lubricant to the lubrication point, in which the lubrication device comprises a connector. The method comprises removably connecting the connector to the fitting such that a fluid conduit is formed between an interior of the device to be lubricated at the lubrication point and a lubricant container of the lubrication device, and such that an electrical path between an integrated circuit of the fitting and a processor of the connector is formed via a first electrical contact of the fitting contacting a second electrical contact of the connector. The method further comprises sending an identification code to identify the fitting from the integrated circuit to the processor via the electrical path.

These and other aspects of the present invention will be apparent from and elucidated with reference to the embodiment(s) described hereinafter.

The independent and dependent claims describe specific and preferred features of the invention. Features of the dependent claims can be combined with features of the independent claims and with features of other dependent claims as deemed appropriate, and not necessarily only as explicitly stated in the claims.

BRIEF DESCRIPTION OF THE DRAWINGS

FIG. 12 illustrates a part of a connector in accordance with embodiments of the present invention.

FIG. 13 illustrates a part of a connector in accordance with embodiments of the present invention.

FIG. 14 illustrates a part of a connector in accordance with embodiments of the present invention.

FIG. 15 illustrates a connector in accordance with embodiments of the present invention.

Figure 1:
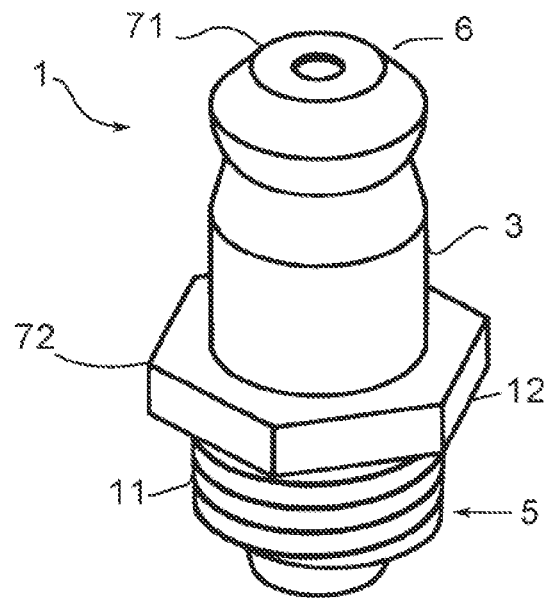
FIG. 1 illustrates a fitting in accordance with embodiments of the present invention.
Figure 2:
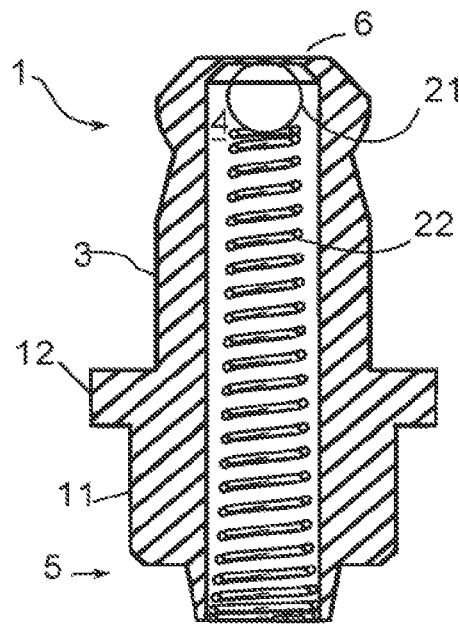
FIG. 2 illustrates a fitting in accordance with embodiments of the present invention.

The drawings are schematic and non-limiting. Elements in the drawings are not necessarily represented on scale, e.g. an element may be exaggerated for illustrative purposes or reduced in scale to keep the drawing clear and comprehensible. The present invention is not necessarily limited to the specific embodiments of the present invention as shown in the drawings. Reference signs in the claims shall not be construed as limiting the scope. In different drawings, the same reference signs may refer to the same or analogous elements.

DETAILED DESCRIPTION OF THE INVENTION

The present invention is only limited by the attached claims, notwithstanding the exemplary embodiments described hereinbelow. The attached claims are hereby explicitly incorporated in this detailed description, in which each claim, and each combination of claims as allowed for by the dependency structure defined by the claims, forms a separate embodiment of the present invention.

The word "comprise," as used in the claims, is not limited to the features, elements or steps as described thereafter, and does not exclude additional features, elements or steps. This therefore specifies the presence of the mentioned features without excluding a further presence or addition of one or more features.

Ordinal references, such as first, second and the like, in the description and/or in the claims may be used to discern similar elements and do not necessarily define a sequence, either temporally, spatially, in ranking or in any other manner. Such terms may be interchangeable under appropriate circumstances and embodiments of the invention may relate to other sequences than explicitly described or illustrated herein.

Spatial references, such as top, bottom, on, under and the like, in the description and/or in the claims are used for descriptive purposes and not necessarily only for describing relative positions. It shall be clear that embodiments may relate to other positional arrangements of elements described using such spatial references, unless the relative positioning would be necessary for achieving the desired technical effect, i.e. for solving the underlying objective technical problem, as would be evident to the skilled person. Therefore, it is clear that such terms are interchangeable under appropriate circumstances and that embodiments of the present invention may be capable of operation in other orientations than described or illustrated herein.

In this detailed description, various specific details are presented. Embodiments of the present invention can be carried out without these specific details. Furthermore, well-known features, elements and/or steps are not necessarily described in detail for the sake of clarity and conciseness of the present disclosure.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments. References to "embodiments" or "in embodiments" are to be interpreted in the same way.

Various features of the invention may be grouped together in a single embodiment, figure, or description thereof for the purpose of streamlining the disclosure and aiding in the understanding of inventive aspects. This is not to be interpreted as reflecting an intention that the claimed invention requires more features than are expressly recited in each claim. Rather, as the following claims reflect, inventive aspects may lie in less than all features of a single foregoing disclosed embodiment as explicitly described in the description. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention relates in a first aspect to a fitting for a lubrication point of a part (e.g. a bearing) of a machine or vehicle, that is adapted for removably and temporarily being connected to a connector in accordance with the second aspect of the present invention such as to receive a lubricant from the connector and guide the lubricant into the lubrication point.

Referring to FIG. 1 to FIG. 9, various features of a fitting 1 in accordance with embodiments of the present invention are shown (yet not necessarily the same fitting in accordance with embodiments is shown in all drawings). Note that not all features may be shown in each drawing such as not to complicate the illustrations and to aid in understanding the underlying principles.

The present invention relates in a second aspect to a connector for a lubrication device, such as a grease gun, that is adapted for removably and temporarily being connected to the fitting in accordance with the first aspect of the present invention such as to provide a lubricant from the lubrication device to the fitting. The connector may comprise a grease gun head, or may be suitable for attaching to a conventional grease gun head as an attachment or add-on.

Figure 10:
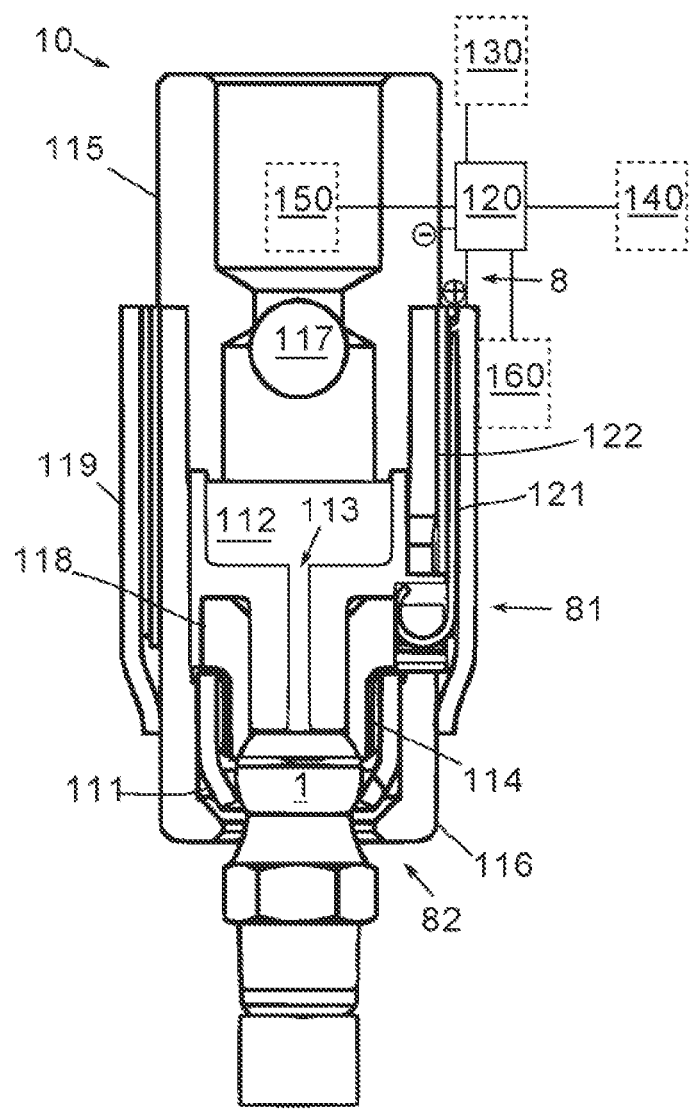
FIG. 10 illustrates a connector in accordance with embodiments of the present invention.
Figure 11:
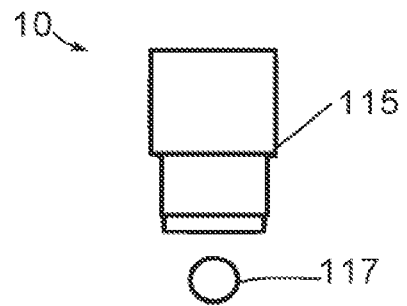
FIG. 11 illustrates parts of a connector in accordance with embodiments of the present invention.
Figure 11:
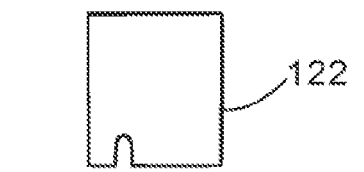
Figure 11:
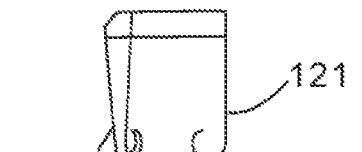
Figure 11:
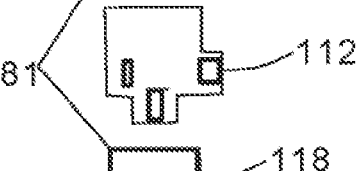
Figure 11:
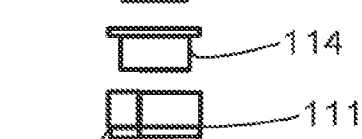
Figure 11:
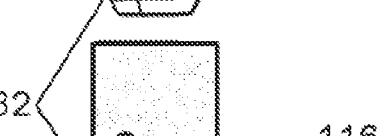
Figure 11:
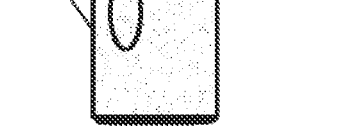
Figure 11:
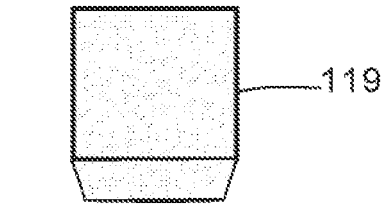

Referring to FIG. 10 to FIG. 20, various features of a connector 10 in accordance with embodiments of the present invention are shown (yet not necessarily the same connector in accordance with embodiments is shown in all drawings). Note that not all features may be shown in each drawing such as not to complicate the illustrations and to aid in understanding the underlying principles. FIG. 11 shows an exploded view of the connector shown in FIG. 10, to allow the reader to better distinguish the components of this illustrative connector 10. FIG. 10 shows, additionally, also a matching fitting 1 in accordance with embodiments of the present invention, in which the connector 10 and the fitting 1 are mutually engaged. This is merely for illustrative purposes, and should not be construed as the fitting 1 forming a part of the connector 10.

The present invention relates in a third aspect to a printed circuit board element for attaching to a fitting for a lubrication point, i.e. a fitting as known in the art, to collectively form a fitting in accordance with embodiments of the first aspect of the present invention.

The present invention relates in a fourth aspect to a grease gun, comprising a connector in accordance with embodiments of the second aspect of the invention.

The present invention relates in a fifth aspect to a lubricant dispenser system, e.g. comprising at least one grease gun in accordance with embodiments of the fourth aspect of the present invention and one or more fittings, e.g. grease nipples, in accordance with the first aspect of the present invention.

The fitting 1 may particularly be a grease nipple, e.g. a grease nipple with a conical head. The fitting comprises a body 3 in which a fluid conduit 4 is formed. For example, the body may be composed of steel, e.g. stainless steel. The steel material may be hardened and/or electro-plated, e.g. zinc-plated. The fluid conduit 4 is adapted for allowing a lubricant to flow through the fluid conduit 4.

For example, the body 3 may comprise a neck section 26 in between (along a longitudinal axis) a bolt section 12 and a head section, whereas a diameter of the fitting is narrower in the neck section than in the bolt section as well as in (at least a widest cross section of) the head section. The head section may be located at the inlet end of the body, e.g. may comprise the inlet 6.

A contact surface of the body 3 of the fitting and a contact surface of the connector 10 in accordance with embodiments of the second aspect may have complementary shapes, e.g. shapes fitting onto each other. The body, or part of the body, of the fitting may have a convex shape, and the connector may comprise a complementary concave tip. Or similarly, the body, or part of the body, of the fitting may have a concave shape, and the connector may comprise a complementary convex tip. Even though complementary surfaces of matching curvature may be preferred, embodiments in which the fitting and its corresponding connector have flat contact surfaces are not necessarily excluded in embodiments in accordance with the present invention.

Thus, the fitting 1 may receive a lubricant via the connector 10. The mechanical connection between these parts may be based on prior-art systems, e.g. known grease nipples and complementary grease gun heads.

The connector 10, as illustrated in FIG. 10 and FIG. 11, may be similar to the hydraulic coupler M10x1 female SW 13 mm—diameter 15 mm, item number 12631, as commercially available from Pressol Schmiergerate GmbH, Germany, on the date of filing of the present application. Features of this prior art device may be considered as included as optional features of a connector 10 in accordance with embodiments of the present invention. However, this is merely an example, and embodiments of the connector 10 in accordance with embodiments of the present invention are not limited to features of this specific example. Furthermore, it should be noted that different sizes, dimensions and shapes are known in the art for lubricant fittings and corresponding connectors for lubricant dispensers, and embodiments of the present invention should not be construed as necessarily limited to specific sizes, dimensions and/or shapes known, or even presently not yet known, in the art.

The connector 10 is adapted for removably and temporarily being connected to the fitting 1, e.g. in the form of a conic head grease nipple, in accordance with embodiments of the present invention and to provide a lubricant from a lubrication device, e.g. a grease gun, to the fitting. For example, as is known in the art, a resilient element (not shown), such as a spring may press a flexible element 112, such as a vulcanized rubber element, onto and/or around the conic head of a fitting. It is to be noted that the flexible element 112, in some embodiments, may store sufficient mechanical energy when compressed to act as the resilient element, e.g. a spring, such that a separate resilient element may not be needed. The flexible element 112 is generally dimensioned and shaped to fit around and/or onto the head of the fitting, i.e. around the inlet 6. The flexible element 112 has a through hole or conduit 113 defined therein to allow the lubricant, in use of the device, to pass from the lubricant dispenser to the inlet 6 of the fitting 1. This resilient element may be tensioned by a manual force in the opposite direction, i.e. an operator pressing the connector 10 onto and/or over at least the inlet 6 of the fitting 1, e.g. onto and/or over the head of the fitting 1. The flexible element 112 forced onto the fitting thus creates a tight seal between the connector 10 and the fitting 1, such that the lubricant can be transferred without leakage and/or contamination from the exterior environment. Between the flexible element 112 and, in use, the fitting, the connector 10 may comprise a washer or sleeve 114. The washer or sleeve 114 may be composed of a suitable low-friction material, such as a polyamide, e.g. a "nylon" material. The flexible element 112 may be (mechanically) connected to (or mechanically contacted by) and/or or supported by a support structure 115, e.g. a metal part, e.g. metal hull, which is generally located on the opposite side of the flexible element 112 than the side where the washer or sleeve 114 is located that, in use, contacts the fitting. The washer or sleeve 114 and the support structure 115 may thus protect the flexible element from wear and tear. The connector 10 may also comprise a plurality of clamps 111, which are positioned radially outward of (e.g. and angularly distributed around) the flexible element. When the connector is pushed far enough over the fitting, the clamps 111 may lock in a locally stable position (i.e. a position that is a local optimum but not a global optimum), i.e. by forming a temporary constriction around a neck part 26 of the fitting.

The resilient element may (locally) stabilize the local potential mechanical energy optimum corresponding to this metastable position. As known in the art, this configuration may be used to create a tight seal, and can easily be disconnected by increasing the angle of the longitudinal axis of the (head of the) fitting with respect the longitudinal axis of the connector. This creates a smooth transition from the locally metastable position to a global optimum in which the resilient element releases its tension by a sliding movement of (at least initially) one side of the flexible element over the head of the fitting. The support structure 115 may be fastened to a second support structure 116, e.g. by a screw thread connection or other fastening means. This second support structure 116 may be a metal hull that (tightly) fits into the first support structure 115, or vice versa.

In the first support structure 115, a channel may be defined through which the lubricant can flow from a dispenser device to the channel in the flexible element 112. Thus channel may have a constriction, in which a ball 117 may be provided to act as a ball check valve. This ball may be tensioned against the constriction in the channel in first the support structure 115 by a suitable resilient element (not shown), e.g. a spring. Thus, when the connector 10 is disconnected from the fitting 1 after supplying the lubricant, the ball check valve may prevent (or reduce) a flow of lubricant out of the connector.

Figure 16:
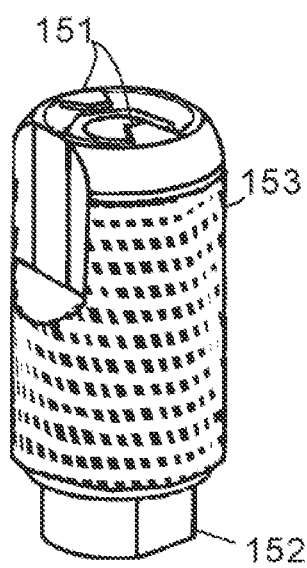
FIG. 16 illustrates a connector in accordance with embodiments of the present invention.
Figure 17:
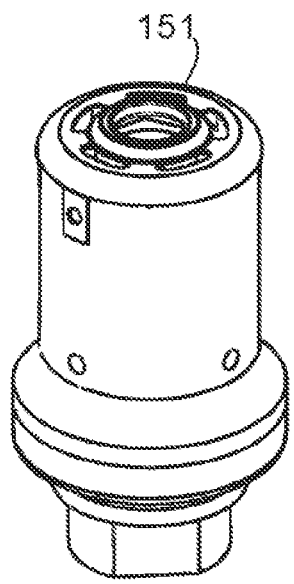
FIG. 17 illustrates a connector in accordance with embodiments of the present invention.

Another illustrative connector 10 in accordance with embodiments of the present invention is shown in FIG. 14 to FIG. 16. This connector may be similar to the universal lock-on grease gun coupler UC3102, as commercially available from Univer-Co, Canada, on the date of filing of the present application. Features of this prior art device may be considered as included as optional features of a connector 10 in accordance with embodiments of the present invention. However, this is merely an example, and embodiments of the connector 10 in accordance with embodiments of the present invention are not limited to features of this specific example. Furthermore, it should be noted that different sizes, dimensions and shapes are known in the art for lubricant fittings and corresponding connectors for lubricant dispensers, and embodiments of the present invention should not be construed as necessarily limited to specific sizes, dimensions and/or shapes known, or even presently not yet known, in the art.

Figure 19:
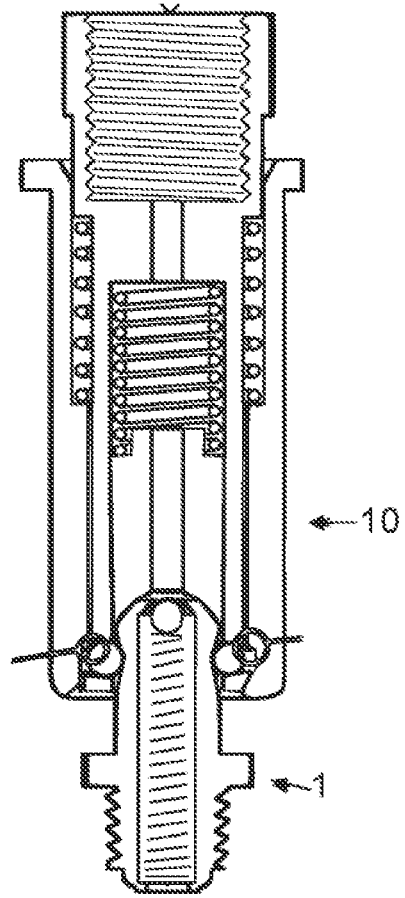
FIG. 19 illustrates a connector in accordance with embodiments of the present invention.

In this illustrative connector 10 in accordance with embodiments of the present invention, a channel is defined in a base 201 and a core 202, through which the lubricant can flow into the inlet 6 of the fitting 1, when coupled. The core 202 may be configured in a sliding arrangement with respect to the base 201. A resilient element 203, e.g. a spring, provides the tension to create a tight seal of the core 202 around the head of the fitting 1, when coupled. The core 202 is furthermore fitted with a sealing element 209, e.g. a rubber element, to provide a watertight seal between the core 202 and the base 201. The base 201 houses a plurality of balls 204, e.g. forming a sliding bearing, e.g. in a cylindrical groove provided in the interior surface of the base. In a disengaged state, the balls 204 are kept in place by the core 202, the base 201 and a slidable cover 205. In an engaged state, the balls 204 are trapped in the groove formed by a neck section of the fitting 1 and pressed tightly around the neck section by sliding the slidable cover 205 downward, in which the slidable cover has a smaller inner diameter around the balls when slid into the engaged position and a wider inner diameter around the balls when slid to the disengaged position. The connector 10 may be disengaged from the fitting 1 by sliding the slidable cover 205 up (away from the fitting), such that the balls are no longer clamped around the neck of the fitting, and can move to release the head of the fitting. The configuration of this illustrative connector 10, when engaged with the fitting 1, is illustrated in FIG. 19. The connector 10 may comprise at least one electrical contact element 151 that is supported by the slidable cover 205 of the component 152 as shown in FIG. 14.

It is to be noted that, while, insofar considering the mechanical aspects, a connector 10 in accordance with embodiments of the present invention may be similar to a prior art connector, non-obvious differences may still exist. For example, in an illustrative embodiment, the balls 204, e.g. steel balls, shown in FIG. 14 and FIG. 19, are clamped by a slidable cover 205 (e.g. a hull or shell) around the neck of the fitting, when engaging therewith. The slidable cover, when compared to similar prior art systems, can traverse a longer distance in the longitudinal direction of the device, e.g. by adaptation of the spring system 281 that provides the slidable configuration or by including a secondary sliding frame. Thus, the slidable cover 205 can slide, in the longitudinal direction, further away from the coupling end where the connector, in operation, connects to the fitting. This extra distance is provided, in this example, to accommodate the additional space required for the electrical contact(s) 151, while still providing a mechanical clamping action at the correct position.

Referring back to the fitting 1, the body 3 comprises a fixation end 5 for fastening, e.g. permanently or at least robustly, the fitting into or onto the lubrication point. Particularly, when fastened to the lubrication point, a seal is formed around the body (i.e. at least around a part of the body, such as around the fixation end of the body) between the lubrication point and the body, such that the fluid conduit 4 forms a canal to introduce the lubricant into the machine part, e.g. bearing, while the seal around the body prevents the lubricant to flow back out of the machine part.

For example, the body 3 may comprise a screw thread 11 (e.g. a male screw thread; e.g. an external screw thread) at the fixation end 5 to fit the fitting 1 into a complementary screw thread (e.g. a female screw thread; e.g. an internal screw thread) formed in the lubrication point. The screw thread may be a tapered thread.

As an example, the screw thread for fitting the body 3 of the fitting 1 to the machine to be lubricated may be an ISO metric screw thread, per ISO 261 or ISO 262, such as an M8 thread, i.e. having a nominal diameter (e.g. maximum external thread diameter) of 8 mm and a 'coarse' pitch of 1.25 mm.

The body 3 may comprise (or may be shaped as) a bolt 12, e.g. a hexagonal nut exterior surface, to allow the fitting 1 to be fitted by means of a wrench or similar tool into/onto the lubrication point. For example, the bolt 12 may be an M9 hexagonal bolt, e.g. a hexagonal bolt in the range M9 to M12.

The body comprises an inlet 6 at an inlet end of the body, e.g. that is opposite of the fixation end 5. In the fluid conduit 4, a check valve may be provided that is adapted for resisting a flow of a lubricant from the fixation end 5 toward, and out of, the inlet 6 and for allowing a flow of the lubricant from, and into, the inlet 6 toward the fixation end 5 when the lubricant is provided at a pressure exceeding a predetermined yielding pressure.

As known in the art, such check valve may comprise a ball 21 and a resilient element 22, such as a spring, for pressing the ball in the fluid conduit toward the inlet such that the inlet is blocked by the ball in a neutral position. When a lubricant is provided at the inlet end under a pressure exceeding the yielding pressure, the ball is pressed back by this pressure into the fluid conduit, into a forced position, in which the lubricant can flow past the ball into the fluid conduit and through the fixation end into the part to be lubricated.

The fitting 1 may be similar to a grease nipple as known in the art, such as a grease nipple with a conical head in accordance with DIN 71412 and/or DIN 71418 and/or ISO 3799 and/or ISO 6392 and/or DIN 3405 and/or DIN 3404 and/or SAE J534. Where different versions of the aforementioned standards exist, reference is made to the most recent version that has been made available to the public prior to the date of filing of the present application. For example, the fitting may be a lubricating nipple of the cone type in accordance with DIN 71412:1987-11. Any feature of such cone-type lubricating nipple specified by, or referred to in, said standard is hereby explicitly included as an optional feature of a fitting 1 in accordance with embodiments of the present invention.

As shown in the illustrations, the fitting may be a "straight" fitting, i.e. in which the inlet end and the fixation end are arranged on opposite ends of the fitting along a straight longitudinal axis, but embodiments are not limited thereto. For example, as known in the art, the fitting may form an angle between the fixation end and the inlet end, e.g. a 45° angle or a 90° angle (without necessarily limiting embodiments to these specific angles).

The fitting comprises an integrated circuit 2, e.g. a microchip, that is adapted for providing an identification code for (e.g. uniquely) identifying the fitting. The integrated circuit may comprise an electronic memory for storing or generating an identification code for (e.g. uniquely) identifying the fitting.

The integrated circuit 2, e.g. a microchip, may be embedded in a protective material, e.g. a polymer material, to physically (e.g. mechanically) protect and insulate (e.g. electrically and/or thermally) the integrated circuit. For example, the integrated circuit 2 may be cast or molded inside a package formed by a casting or molding material, e.g. a setting material, such as a time setting or thermosetting material.

Figure 3:
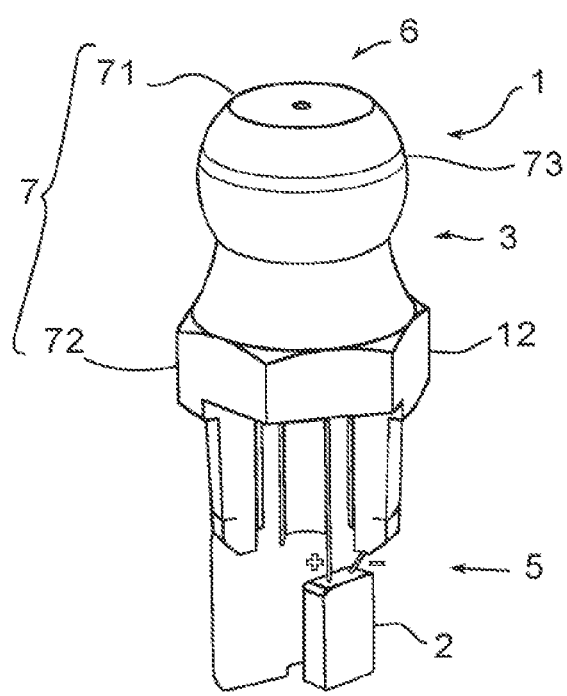
FIG. 3 illustrates a fitting in accordance with embodiments of the present invention.
Figure 4:
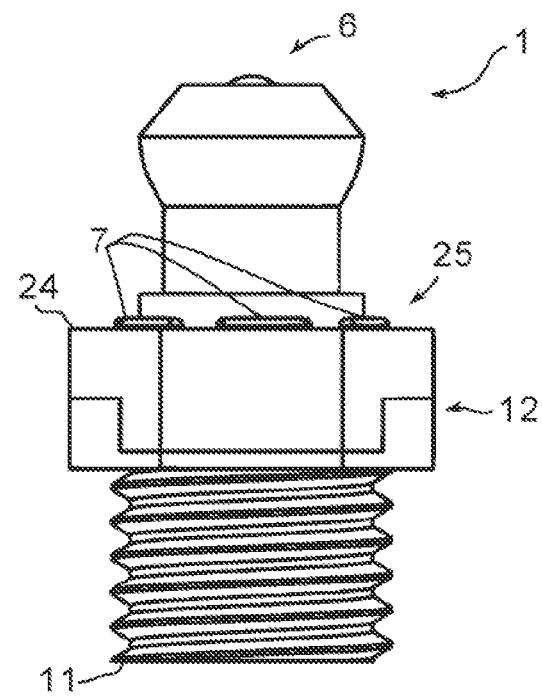
FIG. 4 illustrates a fitting in accordance with embodiments of the present invention.

For example, as illustrated in FIG. 3, the integrated circuit 2 may be embedded in the protective material which is located in the fitting, e.g. inside the body, at or near the fixation end 5. However, embodiments are not limited thereto. For example, the integrated circuit, e.g. embedded in the polymer material, may be located inside and/or underneath the screw thread 11 (underneath referring to being located further toward the fixation end of the body relative to the thread). Thus, the integrated circuit may, in use, i.e. when installed, be located inside the machine to be lubricated. The integrated circuit may comprise one or more sensors for detecting one or more properties of the lubricant and/or the machine, which can advantageously be communicated via the connector, when connected thereto, to a receiver, e.g. a processor of the connector. For example, the one or more properties may comprise detection of the presence of the lubricant, e.g. detecting when the machine is running dry such that a warning can be generated to draw the attention of the operator to this fact, e.g. such as to initiate a thorough inspection. For example, the one or more properties may comprise a viscosity of the lubricant, a temperature of the lubricant, a pressure of the lubricant or other intrinsic or extrinsic properties of the lubricant. For example, the one or more properties may comprise vibration or movement (e.g. linear or angular velocity or acceleration), e.g. such as to detect whether the machine to be lubricated is operating, or to detect whether the machine to be lubricating is idling.

However, in embodiments where the integrated circuit is located underneath the screw thread, the height of the fitting may be increased relative to a similar prior-art fitting. This may imply that some lubrication points of pre-existing machines to be lubricated do not provide sufficient room to accommodate the fitting. Therefore, for a fitting according to such embodiments of the present invention, it may be needed to deepen the depth of screw holes provided at a lubrication point of a machine. This may be cumbersome, or at least require additional work, and may not be possible under all circumstances without damaging the machine to be lubricated and/or voiding a manufacturer's guarantee. Therefore, it may be preferable to accommodate the integrated circuit at a different location in or on the fitting in accordance with some embodiments of the present invention, even though the aforementioned location underneath the screw thread may be preferred for other reasons in accordance with other embodiments of the present invention, e.g. to allow the integrated circuit to take sensor measurements indicative of the lubricant as present before the lubricant is topped up and/or indicative of the properties of the machine or the interior environment of the machine.

Furthermore, temperature tolerances of the integrated circuit and typical operating temperatures of the machine (or a specific bearing thereof) intended to be lubricated may also be taken into account in selecting a suitable location of the integrated circuit in or on the fitting (as well as in selecting the protective material in which the integrated circuit may be embedded).

Each fitting and its associated lubrication point (when the fitting is installed thereon) can have a unique identification code attributed thereto. Each fitting can be preprogrammed to store a unique identification code, e.g. during the manufacturing process of the fittings. While these codes are preferably unique, it shall be clear that when a number (without embodiments being limited to numeric codes) is assigned from a sufficiently large range, the probability of two fittings having the same identification code being used concomitantly in the same plant or vehicle can be kept sufficiently small, i.e. substantially zero.

The electronic memory may comprise a persistent (non-volatile) rewritable memory, such as a flash memory. The electronic memory may also comprise a strictly read-only memory (ROM), such as a hardwired diode matrix or a mask ROM integrated circuit. The electronic memory may comprise an (electrically) erasable programmable read-only memory (EPROM or EEPROM).

The integrated circuit may also comprise a physical unclonable function (PUF). The (unique) identification code of the fitting may thus be established by the properties of a microstructure embodying the PUF. However, this structure itself may advantageously not be revealed by a challenge-response exchange used for authenticating a fitting. Thus, the identification code may be formed by a challenge-response authentication mechanism. Via the connector, a challenge may be submitted to the integrated circuit, which may apply a corresponding physical stimulus to the PUF structure. The result may then be returned to the connector via the first electrical contact 7. Since the PUF responds in an unpredictable but repeatable way to the challenge stimulus, advantageously a more secure system of authentication and security can be provided. For example, each grease gun may have its own challenge signature, and may keep a list of responses to this challenge for identifying the different grease nipples it is to interact with. Furthermore, this challenge signature may be changed periodically, and the grease gun may, after identifying a grease nipple, issue a second challenge corresponding to the next signature it will use, to receive and store the response of the validated grease nipple to the new challenge. Furthermore, the integrated circuit may be adapted to (e.g. programmed to or designed to) only accept challenges that satisfy a validation criterium. This allows the nipple to only recognize original connector counterparts, by a security feature codified by the validation criterium. Furthermore, the integrated circuit of the fitting may be programmed to respond with a random response (i.e. unpredictable as well as unrepeatable or hard to repeat) if the challenge fails to satisfy the validation criterium. Thus, by relying on a system of challenge-response authentication instead of a single identification key, security of the environment is increased, e.g. tampering with the nipple or grease gun becomes more difficult, and the manufacturer can be protected to some degree against the use of counterfeit parts.

While one approach for authenticated identification of the fitting to which the connector connects is described, e.g. based on a physical unclonable function and a challenge-response mechanism, it shall be clear that the same principle can be embodied in different ways. For example, rather than providing a PUF, a cryptographic key can be stored in a conventional memory and an authentication can be implemented based on, for example, a combination of private and public key communication, e.g. in which the connector (e.g. grease gun) stores a public key of the fittings (e.g. grease nipples) and the integrated circuit in the fitting stores a corresponding private key. A public key authentication mechanism can then be used to authenticate and identify the fitting. Two-way authentication can also be used, in which each connector also stores a private key, and the public key of the connector(s) are stored in the fitting for counter-authentication.

Thus, every fitting 1 in an environment, such as a plant or a vehicle, may have a unique identification code, which may be preprogrammed or configured in the integrated circuit 2, or may be generated by the integrated circuit in a unique yet repeatable manner.

When a connection, i.e. a mechanical and electrical coupling, between the fitting 1 and the connector 10 is established, a processor 120 of the connector receives the identification code from the integrated circuit 2 in the fitting 1. Thus, the connector of the lubrication device and the fitting are configured to only permit the transmitting of the data (in particular, the identification code) to the processor when a proper mechanical coupling between the fitting and the connector is established. The connector comprises a processor 120 that may comprise an electronic memory. While reference is made to a "processor", this does not necessarily imply a general-purpose programmable processor, e.g. a central processing unit, but may also refer to an integrated circuit that is specifically designed for performing the functions described herein, e.g. an application-specific integrated circuit (ASIC), or a processing unit that is physically configurable instead of being programmable in the conventional sense, e.g. a field-programmable gate array (FPGA) device. Other devices which can be designed, configured and/or programmed are also considered to fall within the scope of the generic term "processor", such as a distributed processing system (e.g. in which the connector merely provides an interface to remote parts dedicated to processing), a parallel processing system, e.g. a graphics processing unit, a cell processor, and the like. The processor is adapted for receiving the identification code from the integrated circuit of the fitting. The processor 120 may be adapted for storing the identification code in the memory or for storing an identification of the fitting, determined on the basis of the identification code, in memory, e.g. in a log. The log may comprise timed events, e.g. a timestamp to indicate when each specific and identified fitting was mechanically and electrically coupled to the connector.

As an example, the log, stored in memory, may comprise a plurality of events, in which each event may comprise a timestamp, the identification of the fitting coupled to the connector, and a temperature measurement. For example, the temperature measurement may be obtained by a sensor integrated in the connector, e.g. measuring the temperature of the nipple by thermal contact, or by a sensor integrated in the fitting, e.g. in the integrated circuit.

Thus, the memory of the processor 120 may be adapted for storing, e.g. logging, the connection. Other data may be stored as well, such as an amount of lubricant that was injected through the connector. Failed attempts of connecting the connector to a fitting can also be logged, e.g. when either an abnormally short electrical contact was made, e.g. a connection that lasted less than a predetermined time threshold, or where no lubricant was/could be injected. The processor 120 may also log failed connection attempts that are the result of mechanical incompatibility between the connector and fitting, in cases where the connector is designed to mechanically couple only with fittings having the appropriate geometrical properties (in a "lock and key" fashion). The processor 120 may also log attempts to operate the lubricant dispensing system while a warning for an anomaly is in effect (the anomaly signaling features are described in more detail below). The processor 120 may also receive additional data from the integrated circuit 2, such as sensor data, and store this information, or data derived therefrom, in the memory.

The connector 10 may comprise a communication module 130, e.g. a WiFi, Bluetooth, GPRS or other wireless communication module, for sending the information stored in memory to a server. The communication module 130 is operably connected to the processor 120. The information may be exchanged with the server on a continuous basis, e.g. periodically during a service run, or after a service run is completed. The communication module may also be adapted for exchanging data via a wired bus or network, such as an ethernet connection and/or a universal serial bus (USB) interface, without limitation to these illustrative interfaces.

The connector 10 may comprise a display 140 for displaying information to a user. The displayed information may include information that is determined by the processor 120 on the basis of the identification of the fitting 1. The display may show a diagram of a plant, in which the location where the identified fitting is installed is highlighted. The display may show an amount and/or type of lubricant that is associated with the identified fitting. The display may show a periodicity of servicing that is associated with the identified fitting, or an indication for drawing the attention of the user when a next service time for servicing the lubrication point has not yet been reached, or has been substantially exceeded.

Figure 18:
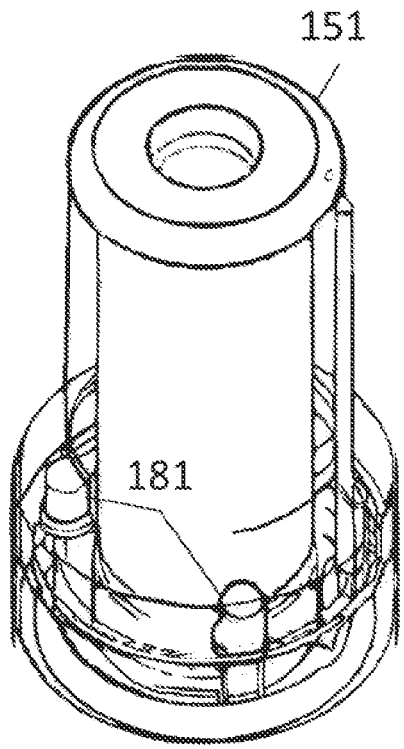
FIG. 18 illustrates a connector in accordance with embodiments of the present invention.

Referring to FIG. 18, the connector 10 may comprise an alert generator 181, such as a light source, a sound source, and/or a vibration source. This alert generator 181, e.g. at least one light emitting diode (LED) mounted in or on the connector, e.g. in a transparent base cover thereof, may be controlled by the processor 120 to indicate a status to the operator. For example, such status may indicate that an electrical connection is established with the fitting, and a communication path with the integrated circuit is established. Such status may also indicate whether the identification of a connected fitting corresponds to a target fitting, e.g. a next fitting in a scheduled sequence of fittings to service. The status may also indicate whether a fault condition is detected. For example, a sensor in the integrated circuit may indicate that the lubricant inside the lubrication point, i.e. before pressurizing a lubricant dispenser connected via the connector to the fitting, is missing or below a predetermined threshold pressure, and/or above a predetermined threshold pressure. In embodiments where the grease gun is adapted to identify the lubricant present in it, for example by reading an RFID tag provided on the grease canister, a status may indicate that the lubricant type associated with the identification of a connected fitting does not correspond to the lubricant present in the grease gun. Different statuses may be indicated, for example, by different colors of light. For example, the alert generator 181 may comprise one or more multi-color LEDs. A convenient exemplary signaling scheme may use a green signal to indicate the occurrence of a correct mechanical and electrical coupling, a yellow signal to indicate the presence of a non-critical anomaly, and a red signal to indicate a critical anomaly.

The user may also be alerted to an incorrect or incomplete coupling by means of a purely mechanically operating indication. In one example, a clamp or lever is provided that can only be placed in its target position when the mechanical coupling is complete, such that any deviation from said target position is a visible indication for the end user that the mechanical coupling may not be complete. In another example, a clearly recognizable signaling portion of the connector 10 (e.g., a brightly colored part) only becomes visible when the mechanical coupling is complete, for example by virtue of a sleeve with a window which is moved by the fitting during the coupling process in such a way as to reveal the signaling portion through the window; the absence of a visible signaling portion is again a clear indication to the user that the mechanical coupling is not complete. Conversely, the connector may be equipped with a clearly recognizable signaling portion that indicates that a correct mechanical coupling has not been achieved, said signaling portion being obscured by a movable part as soon as correct mechanical coupling has been achieved.

It is known that users sometimes ignore warnings and proceed with the lubricant dispensing process when this is not appropriate. To prevent damage to the system which may result from dispensing lubricant when there is a mismatch between the type of system expected by the connector and the actual system or when a fault condition is present, the connector 10 may be configured to electronically prevent dispensing lubricant into the fitting when the identification of the connected fitting does not correspond to the target fitting or one of the above mentioned fault conditions is detected (it should be noted that this safety feature may be provided independently from the warning signals). Specifically, the system may be configured to only dispense lubricant into the fitting when the identification code matches a predetermined criterion. Additionally or alternatively, the connector 10 may be configured to physically prevent dispensing lubricant into the fitting unless the target fitting is correctly coupled to the connector. The fitting and the connector may be designed in such a way that a correct coupling causes a part of the fitting to engage with an internal part of the connector whereby said engagement opens a flow path for the lubricant and disengagement closes said path. In one example, the internal part of the connector is a valve, pre-tensioned in a closed state by means of a spring or other suitable resilient element, and capable of being opened by contact with a part of the coupled fitting. In another example, the fitting comprises on a part of its outer surface one or more longitudinal grooves or indentations that form channels for the lubricant, and the internal part of the connector is a radial seal that cooperates with the outer surface of the distal end of the fitting so as to close the path for the lubricant until the fitting is pressed sufficiently far into the connector to bring the longitudinal grooves or indentations in a position where they act as a bypass for the radial seal.

The connector 10 may comprise a metering device 150 for automatically dispensing an amount of lubricant into the fitting, in which the amount of lubricant is determined by the processor 120 taking the identification of the fitting 1 into account. Alternatively, the metering device may measure the amount of lubricant released by the operator into the fitting. This factual amount of applied lubricant can be shown to the user, e.g. along a target amount determined on the basis of the identification of the fitting, and/or may be stored in the memory.

The connector 10 may comprise a power source 160, such as a battery or power grid connection. The power source may power the processor 120, and possibly optional components that require power.

The electrical coupling may connect the power source 160 of the connector 10 to the integrated circuit 2 of the fitting, and the integrated circuit 2 may send, once powered by this power source, its identification code via the connection. The processor 120 and the integrated circuit 2 may be adapted for exchanging data by a suitable data communication protocol and/or data communication bus system, such as 1-wire, UART, CAN, LIN, and the like. Preferably, the data communication protocol and/or bus system is suitable for communication over a pair of wires that are also used for providing a power supply pair. However, embodiments are not limited thereto, e.g. more than two (pairs of) separate electrical conductors may make a pairing contact between the fitting and the connector, such that a power supply and a communication signal line can be established independently.

However, approaches to a more complex data exchange than merely transmitting a stored identification code upon activation (receiving power) are also envisioned. For example, as already referred to hereinabove, the processor of the connector may initiate an identification procedure by sending a challenge to the integrated circuit of the fitting, and the integrated circuit may reply with a response, which is variable as function of the challenge. The response may be suitable to enable the processor to uniquely identify the fitting, taking into account the sent challenge. Other variations of this procedure are not excluded, e.g. relating to a known method of authentication and/or identification. The identification procedure may comprise, without limitation, simple unidirectional transmission of a constant identifier (e.g. preprogrammed per fitting, but obviously different across fittings), public-key authentication, symmetric-key authentication and/or combination of authentication and digital signing (e.g. two-way authentication of both the fitting and the connector).

In the lubrication process, the identification code of the fitting 1 can be read by the connector 10, or, more generally, a digital communication between the fitting and the connector is used to authenticate and identify the specific fitting, e.g. using cryptographic authentication methods.

The digital communication (e.g. of the identification code or, in general, of a message that allows to identify the fitting) is conducted via a first electrical contact 7 of the fitting and a second electrical contact 8 of the connector. Advantageously, a connector in accordance with embodiments can be provided in or on a grease gun such that the actions taken by an operator in the lubrication process remain substantially identical as compared to a conventional lubrication approach. The shape of the fitting 1, e.g. grease nipple, and the clamping method of the connector, e.g. grease head, onto the fitting may be substantially the same as a prior-art method, such that the action for the operator to take remains substantially unchanged. However, in accordance with embodiments, the clamping method may also be enhanced to ensure a good electrical contact, while only minimally interfering with the conventional actions of the operator.

The fitting 1 comprises a first electrical contact 7 and the connector 10 comprises a second electrical contact 8, the first electrical contact 7 and the second electrical contact 8 being adapted for establishing an electrical path between the integrated circuit 2 of the fitting 1 and the processor 120 of the connector 10 when a connection, i.e. a mechanical and electrical coupling, between the fitting 1 and the connector 10 is established. Thus, the connector of the lubrication device and the fitting are configured to only establish the electrical path between the integrated circuit of the fitting and the processor of the connector when a proper mechanical coupling between the fitting and the connector is established. As already mentioned, the electrical path may also share a power supply of the connector 10 with the fitting 1.

The first electrical contact 7 may comprise at least two separate electrical conductors 71,72, i.e. electrically insulated from each other, and the second electrical contact 8 may comprise at least two separate electrical conductors 81,82, i.e. electrically insulated from each other, such that the at least two electrical conductors of the fitting form an electrical connection with respectively the at least two electrical conductors of the connector when the fitting and the connector are connected. For example, at least one conductor of the fitting may connect to at least one conductor of the connector to establish a signal path and at least one conductor of the fitting may connect to at least one conductor of the connector to establish a ground path. The at least two separate electrical conductors are operably connected to the integrated circuit 2.

For example, the integrated circuit may be adapted for receiving a power supply via the first electrical contact 7, e.g. via the at least two separate electrical conductors, e.g. one for a 'positive' and one for a 'negative' electrical pole, even though an alternating current power supply is not excluded.

The integrated circuit 2 is adapted for data transmission, e.g. data receival and transmission, via the first electrical contact 7, e.g. via the (or one of the) at least two separate electrical conductors.

The body 3 of the fitting 1 may typically comprise, e.g. may be composed of, a conductive material, e.g. a metal, such as steel, e.g. stainless steel, as is known in the art. The body 3 of a fitting 1 in accordance with embodiments of the present invention may comprise two conductive parts, e.g. metal parts, which are electrically isolated from each other by a dielectric 73, i.e. an electric insulator, such as a thermosetting polymer or vulcanized rubber. These two conductive parts may thus form the two separate electrical conductors 71,72. While this may be an easy and cheap manner to manufacture such fitting that provides two separate electric contacts to form a communication (and, typically, also power) connection, the skilled person should be aware that the dielectric is preferably selected as a material of sufficient quality to withstand friction and other forces due to the repeated clamping and releasing action when a connector in accordance with embodiments is connected to the fitting for topping up the lubricant at the lubrication point. The dielectric may also be selected to be suitable for withstanding (very) high temperatures, e.g. as typically can be encountered in moving machine parts.

The first electrical conductor 71 may be located at or near the inlet end 6, while the second electrical conductor 72 may be located at or near the fixation end 5. The second electrical conductor 72 may be a ground contact, i.e. in operation connected to the electrical ground potential. This second electrical conductor 72 may, advantageously, be electrically connected to the lubrication point, i.e. the body of the machine to be lubricated, in operation, e.g. by the absence of an isolating dielectric between the second electrical conductor and the lubrication point. For example, the second electrical conductor 72 may be formed, e.g. at least in part, by the bolt 12.

This approach may ensure that the fitting is properly grounded through a connection of the machine body to the earth. By connecting this ground to the connector, e.g. to a manually operated grease gun, a potentially dangerous or disruptive voltage difference between the machine and the connector (e.g. and the operator) can be avoided. It is to be noted that a manually operated grease gun would, typically, not be connected to the Earth, i.e. would have a floating ground, while industrial machines would typically be connected to the Earth, i.e. have a non-floating ground. Sharing the ground connection of the industrial machine can thus prevent that the connector (e.g. the chassis of the grease gun) is at quite a different potential than the industrial machine and the Earth, i.e. so that the operator does not get an electric shock upon touching it.

Referring to the illustrative connector 10 shown in FIG. 10 and FIG. 11, the second electrical conductor 82 may be formed by the clamps 111, which engage with the neck section 26 of the fitting, and thus may form part of an electrical path via the body 3 of the fitting 1, e.g. a ground contact (without limitation). These clamps 111 may be in electric contact with the second support structure 116, e.g. which may be a conductive metal hull, and the processor (and/or other relevant components) may connect to this second support structure. However, this configuration is merely illustrative, since many variations for conducting the electric signal from the body 3 of the fitting to the processor 120 can be envisioned. In this example, the second support structure 116 may be surrounded by an electrically insulating cover 119, for protective purposes.

The first electrical conductor 81 may be formed by a metal element 118, e.g. a metal ring, for contacting the first electrical conductor 71 of the fitting 1, in use of the device. This metal element 118 is provided on the flexible element 112, e.g. between the flexible element 112 and the washer or sleeve 114. The washer or sleeve 114 may be adapted for electrically insulating the first electrical conductor 81, e.g. the metal element 118, from the second electrical conductor 82, e.g. the clamps 111, while still allowing a contact between the metal element 118 and, in use, the fitting 1, i.e. a contact pad or contact element thereof that is insulated from the body of the fitting. The washer or sleeve 114 may thus be composed of a dielectric material. The metal element 118 may be in electric contact with a sliding contact 121, e.g. a contact spring. This sliding contact 121 may be electrically insulated from the second electrical conductor 82 by the electrically insulating cover 119 and, radially inward, by a further electrically insulating hull 122. The flexible element 112 may comprise radial openings, through which the sliding contact 121 may engage in a sliding contact with the metal element 118, as can be seen in FIG. 12. A detail illustration of an (illustrative) sliding contact 121 is provided in FIG. 13. The processor 120 (and/or other relevant components) may be connected to the sliding contact 121. Again, it is to be noted that this configuration is merely illustrative, since many variations for conducting the electric signal from the first electrical conductor 71 of the fitting to the processor 120 can be envisioned.

Figure 5:
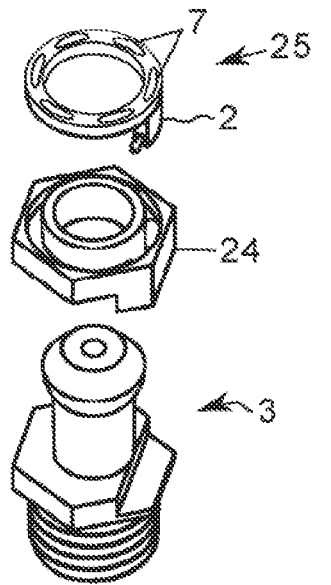
FIG. 5 illustrates a fitting in accordance with embodiments of the present invention.
Figure 6:
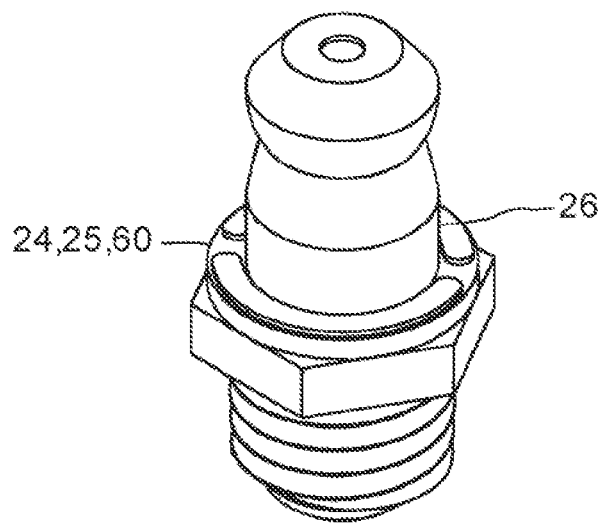
FIG. 6 illustrates a fitting in accordance with embodiments of the present invention.

Referring back to the fitting 1, splitting the body of the fitting into two conductive parts can also be avoided, e.g. in order to avoid problems with adhesion of both parts and the intermediate dielectric. Thus, advantageously, the fitting may be easier to manufacture and more robust. For example, referring to FIG. 4, the integrated circuit 2 may be located in or on a holder 24, e.g. a protective and/or insulating holder. The IC may be molded into the material or the material may be cast in a form having a cavity that can accommodate the IC. The holder may be made of a castable or moldable material. The holder may be composed of a polymer. The holder fits around the body 3, and preferably is made of a dielectric material for electrical insulation. In the example shown in FIG. 4, the holder 24 is adapted in shape to fit into and/or onto the bolt 12, and to conform with the radially outward surface of the bolt such as to form an extension of the bolt surface. The integrated circuit 2 may be connected to the first electrical contact 7, e.g. two, three or more separate electrical conductors in the form of contact pads, which may be provided in a contact element 25 that fits onto and/or into the protective holder, e.g. in the cavity for accommodating the integrated circuit 2. However, the first electrical contact 7 may be left accessible by the complementary second electrical contact 8 when the connector is operably connected to the fitting. FIG. 5 shows how different parts, i.e. the body 3, the protective holder 24 and the contact element 25, may fit together in such illustrative embodiment of the fitting. All electrical contact elements (e.g. at least two electrical contacts) of the first electrical contact may be provided via the contact element 25, or, alternatively, the holder 24 may provide a through-hole through which an electrical conductor (e.g. formed as part of the contact element 25) can conductively connect a lead of the integrated circuit to the body 3, while at least one other contact is provided by the contact element such that the at least one other contact is electrically isolated from the body 3.

Furthermore, as shown in FIG. 5, the contact element 25 and the protective holder 24 may be cointegrated, e.g. may be formed by a printed circuit board (PCB) having a hole that fits around (the neck of) the fitting. The integrated circuit (IC) may also be integrated in or mounted onto the PCB.

Where the contact element (integrated in the PCB or as separate element) provides a plurality of electrical conductors 71,72, . . . forming the first contact 7, these may be separated by a (closest) distance that slightly exceeds (e.g. by a margin in the range of 2% to 20%, preferably 5% to 15%, e.g. about 10%) the dimensions of a corresponding electrical conductor forming part of the second contact of the connector. For example, in the illustrative PCB shown in FIG. 7, two electrical conductors are separated by a gap of about 2.4 mm, while a connector adapted for mechanically and electrically contacting interfacing with a fitting comprising this PCB element may comprise electrical conductors have a width of about 2.2 mm. This has the advantage that the risk that the conductors of the PCB are short-circuited by contacting the overlapping complementary second contact of the connector is reduced or avoided.

The printed circuit board may comprise the first electrical contact 7, e.g. at least two separate electrical conductors 71,72 that are electrically insulated from each other. For example, the integrated circuit may be adapted for receiving a power supply via the first electrical contact 7, e.g. via the at least two separate electrical conductors, e.g. one for a 'positive' and one for a 'negative' electrical pole, even though an alternating current power supply is not excluded. The integrated circuit may be adapted for (e.g. automatically detecting and) exchanging the polarity, e.g. so that an operator can connect a connector in accordance with embodiments to the fitting in an arbitrary orientation (i.e. rotation around the longitudinal axis of the conical head of the fitting).

The printed circuit board may have an outer diameter that is about equal to the outer (maximal) diameter of the body of the fitting. For example, the fitting may comprise an M9 bolt, and the outer diameter of the PCB may be about 9 mm. Even though the shape of the PCB is shown as circular, deviations from this shape are considered to lie well within the scope of the present invention. Likewise, the PCB may have an inner diameter that is suitable for sliding the PCB over the head of the fitting, such that it can be mounted onto the body, e.g. by a suitable adhesive. For example, the PCB may have an opening (hole) that has a diameter of about 6.4 mm, e.g. in the range of 5 mm to 7 mm (dependent on the type and dimensions of the fitting type, of course). The PCB may have a conventional thickness, e.g. in the range of 1 mm to 2 mm, without limitation thereto.

Figure 8:
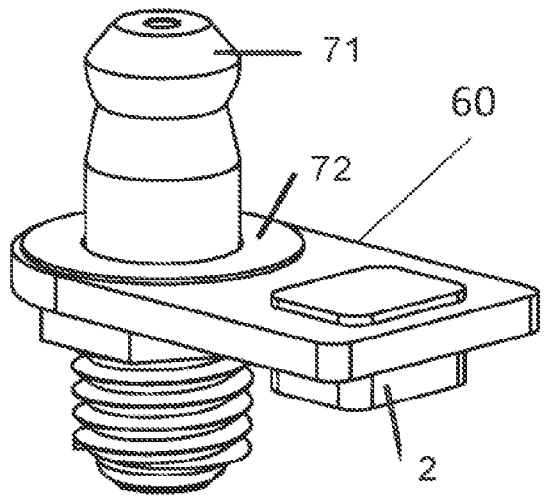
FIG. 8 illustrates a fitting in accordance with embodiments of the present invention.

However, as shown in FIG. 8, the PCB may also have a different shape, for example to accommodate the integrated circuit 2. In the example illustrated in FIG. 8, the PCB provides room to accommodate a rather large IC at some distance from the longitudinal axis of the body 3. This distance may also advantageously protect the integrated circuit from overheating. In this example, the PCB connects one lead of the IC to the body of the fitting, forming the first conductor 71, and a provides a separate second conductor 72 (i.e. insulated from the aforementioned first conductor), to which the IC is also operably connected.

The body 3 of the fitting may have a shape as generally known in the art, but the height of the body may be extended in the neck section 26, i.e. a longitudinal section that is immediately adjacent to the bolt 12 in the direction toward the inlet 6, such as to accommodate the additional height of the PCB or the contact element in another form. It is an advantage that the fitting may thus be compatible with a conventional grease gun. However, embodiments are not limited thereto. As will be clear to the skilled person, design parameters of, for example, the resilient element inside the body may also need to be tuned to take a slightly different length of the body into account.

However, in other embodiments of the present invention, the body 3 of the fitting may have a shape that differs from prior-art fittings, e.g. by a different size, shape or proportion of dimensions. It may be an advantage to prevent compatibility with prior-art grease guns, e.g. for commercial reasons or to ensure that each lubrication action can be logged by using a fitting as well as a connector in accordance with embodiments of the present invention. Furthermore, in an environment where different lubricants are used, it may be advantageous to change the shape, size, dimensions or proportions of the fitting and the corresponding connector, such that a mechanical and electrical coupling between a fitting can only be established with a connector that is attached to, i.e. specifically assigned to, a grease gun for the correct type of lubricant. For example, the outer diameter of the fitting and/or the length of the neck section 26 may vary across different embodiments to ensure that the fitting can only connect to a connector having matching dimensions. As already mentioned hereinabove, failed attempts of connecting the connector to a fitting can be logged, e.g. when either an abnormally short electrical contact was made or where no lubricant was/could be injected, such that action can be taken to prevent such mistakes in the future and/or to ensure that such mistake was not correlated with other errors.

Furthermore, the first electrical contact, e.g. contact pads thereof, may comprise a protective coating to protect the contact from wear due to repetitively establishing contact during lubrication actions. As another measure to reduce the undesirable effects of wear, the contact element, e.g. the PCB, may be provided with protrusions 91 or other relief texture on the contact side, i.e. on the side directed toward the inlet 6 when installed, as intended, on the fitting 1. Thus, these protrusions or relief features will preferentially erode by friction and contact forces to, initially, reduce the wear and tear of the bulk of the contact element. The protrusions or other relief texture may form part of the first electrical contact, i.e. such that an electrical connection can be established (at least partially) through the elevated surface features. The first electrical contact may also comprise a part that is coplanar with the major surface on which the protrusions or other relief features are provided, i.e. such that the same electrical connection or connections are formed when these surface features are abraded.

Another advantage of such surface texture features is that an electrical contact is not as easily disrupted by particulate matter, e.g. sand grains, trapped between the contact element and a corresponding contact element of the connector with which it is intended to engage. For example, the protrusions or surface features may extend over a height of at least 250 μm, e.g. preferably at least 500 μm, e.g. to reduce the effect of trapped sand grains of medium size (e.g. on the Wentworth scale).

Referring back to the illustrative connector 10 shown in FIG. 14 to FIG. 16, the connector 10 may comprise at least one electrical contact element 151 that is supported by a slidable cover 205. The at least one electrical contact element 151 may comprise one or more separate, e.g. insulated from each other, contacts, e.g. contact springs. For a fitting 1 comprising a contact element 25, e.g. optionally integrated in a PCB, the at least one electrical contact element 151 may engage with, e.g. touch, the first electrical contact 7, e.g. two, three or more separate electrical conductors in the form of contact pads of the first electrical contact 7. Insulating elements 153, e.g. hulls, may electrically isolate the at least one electrical contact element 151 from the mechanical connection component 152.

Figure 9:
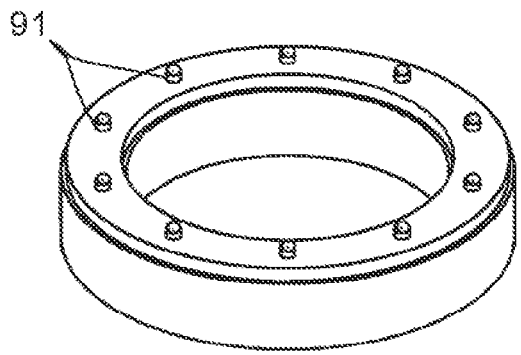
FIG. 9 illustrates a part of a fitting, e.g. a printed circuit board, in accordance with embodiments of the present invention.
Figure 20:
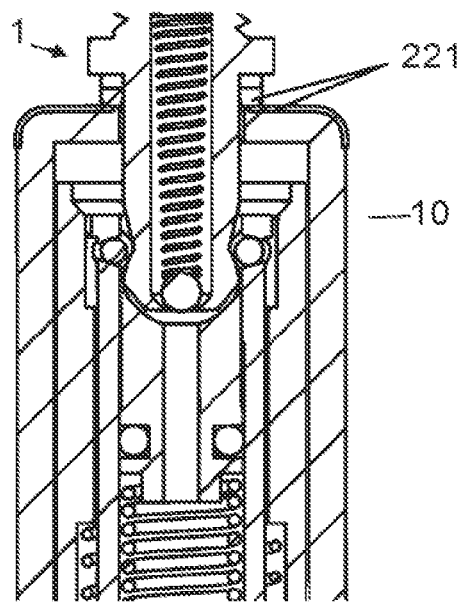
FIG. 20 illustrates a connector in accordance with embodiments of the present invention.

While FIG. 15 and FIG. 16 show two separate electrical contact elements 151, it shall be clear that is merely an example, and many variations on the concepts presented hereinabove can be considered by the skilled person without exercising an inventive effort. For example, referring to FIG. 17 (and FIG. 18), a single electrical contact element, e.g. a contact ring, may be adapted for contacting the fitting. For example, a contact element 25, e.g. a PCB, such as shown in FIG. 8 or FIG. 9 may provide one (e.g. a single, annular) electrical conductor 72 on a surface that can be contacted by such contact ring of the connector 10 when the connector is coupled to the fitting. Another electrical conductor 71 of the fitting may be connected through the core 202 and/or the base 203. In the example shown in FIG. 17, the electrical contact element, e.g. contact ring, does not extend over a substantial portion of the slidable cover 205, e.g. substantially abuts on an end face of the connector, where it is fixed to the slidable cover 205, such that a further insulating element(s) 153 may not be needed. FIG. 20 illustrates the contact 221 between such a contact ring of a connector 10 and an annular electrical conductor 72 of a fitting 1.

The present invention relates in a third aspect to a printed circuit board element for attaching to a fitting for a lubrication point, i.e. a fitting as known in the art, to collectively form a fitting in accordance with embodiments of the first aspect of the present invention. For example, the printed circuit board element may comprise a printed circuit board 60, e.g. as described hereinabove. The PCB 60 may have an opening, e.g. a hole, provided therein, through which the head of a fitting, e.g. a grease nipple, as known in the art fits.

Figure 7:
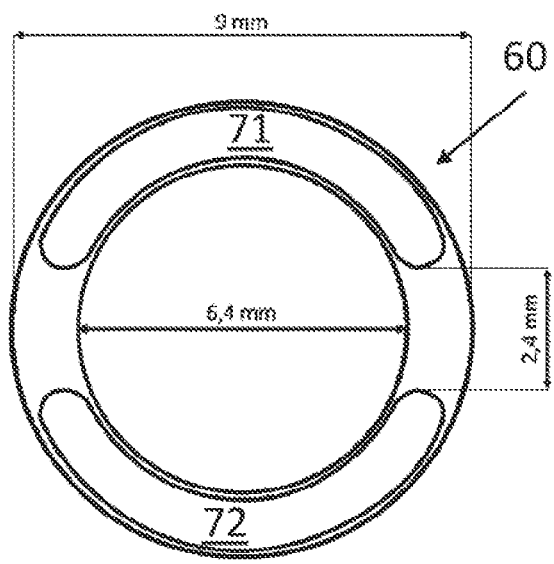
FIG. 7 illustrates a part of a fitting, e.g. a printed circuit board, in accordance with embodiments of the present invention.

The PCB may comprise the integrated circuit 2 as described hereinabove. The PCB may comprise the first contact 7, or part of the first contact 7, in which the remainder of the first contact is formed by a conductive contact between the PCB and the body of the fitting when installed. Referring to FIG. 7, the PCB may have an outer diameter in the range of 7 mm to 20 mm, e.g. in the range of 7 mm to 12 mm, e.g. 9 mm. The PCB may be circular, or may have a shape that can be circumscribed by a (closest fit) circle of said outer diameter. The PCB may have a hole formed therein, i.e. a through hole. The hole may have a diameter (i.e. the inner diameter of the PCB) in the range of 4 mm to 10 mm, e.g. in the range of 5 mm to 7 mm, e.g. in the range of 6 mm to 7 mm, e.g. 6.4 mm. The PCB may have the integrated circuit 2 operably mounted thereon, or the integrated circuit 2 may be integrated in (i.e. may form part of) the PCB. The PCB may comprise at least a first lead connecting the integrated circuit to a first electrical conductor 71, e.g. when installed on a suitable fitting body. The PCB may comprise at least a second lead connecting the integrated circuit to a second electrical conductor 72, isolated from the first electrical conductor 71, e.g. when installed on a suitable fitting body. The PCB may comprise the first electrical conductor and/or the second electrical conductor. The first electrical conductor and/or the second electrical conductor may comprise a contact pad on the PCB. For example, as shown in FIG. 7, the first and second electrical conductor may be formed by contact pads which are substantially shaped as circle segments (distributed around the hole). For example, one of the electrical conductors may be formed by a contact pad that is substantially shaped as a circle around this hole, e.g. an annular electrical conductor, e.g. as illustrated in FIG. 8 and FIG. 9. The other electrical conductor may be formed by the body of the fitting, when the PCB is installed thereon, e.g. connector via a conductive trace on the backside of the PCB (opposite of the frontside where the other electrical conductor is located) and/or on the interior edge of the hole.

Figure 21:
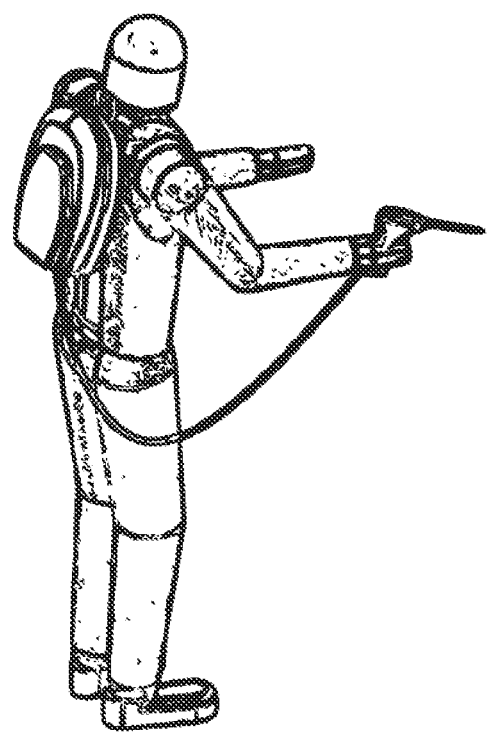
FIG. 21 illustrates a lubricant dispenser in accordance with embodiments of the present invention.
Figure 22:
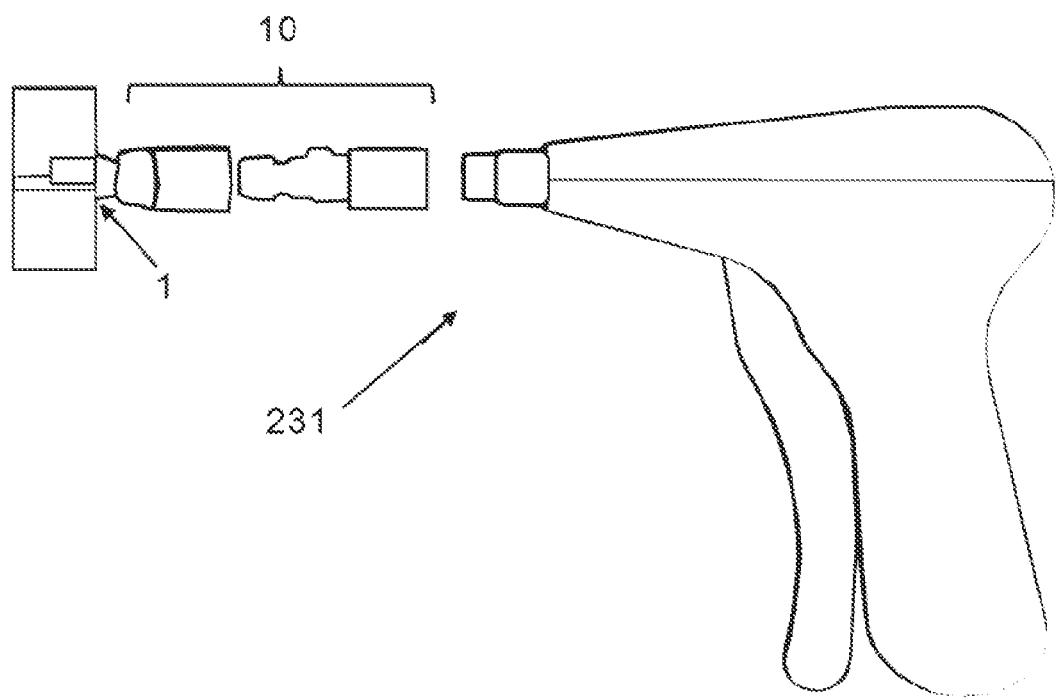
FIG. 22 illustrates a lubricant dispenser in accordance with embodiments of the present invention.

Referring to FIG. 22, the present invention also relates, in a fourth aspect, to a lubrication device 231, e.g. a grease gun, comprising a connector 10 in accordance with embodiments of the second aspect of the invention. Note that FIG. 21 shows different components of the grease gun, as well as the connector, in an exploded view.

Referring to FIG. 21, it is to be noted that, while the device is described as a grease gun, this does exclude one or more parts which are not necessarily handheld, e.g. integrated in a backpack. For example, electronic component(s), a battery and/or a reservoir for containing the lubricant to be dispensed can be integrated in a backpack, which may be operably connected to a handheld part, e.g. via a flexible fluid conduit and/or conductive wire(s).

The present invention relates in a fifth aspect to a lubricant dispenser system, e.g. comprising at least one grease gun 231 in accordance with embodiments of the fourth aspect of the present invention and one or more fittings 1, e.g. grease nipples, in accordance with the first aspect of the present invention.

The present invention relates in a sixth aspect to a method for servicing a lubrication point of a device to be lubricated; in which a fitting 1 is fastened to the lubrication point. The method comprises obtaining a lubrication device 231 to provide a lubricant to the lubrication point, in which the lubrication device comprises a connector 10. The method comprises removably connecting the connector 10 to the fitting 1 such that a fluid conduit is formed between an interior of the device to be lubricated at the lubrication point and a lubricant container of the lubrication device, and such that an electrical path between an integrated circuit 2 of the fitting 1 and a processor 120 of the connector 10 is formed via a first electrical contact 7 of the fitting contacting a second electrical contact 8 of the connector 10. The method further comprises sending an identification code to identify the fitting from the integrated circuit 2 to the processor 120 via the electrical path.

Other features, or details of the features described hereinabove, of a method in accordance with embodiments of the present invention shall be clear in view of the description provided hereinabove relating to a device in accordance with embodiments of the present invention, or vice versa.

The invention claimed is:

1. A connector for removably connecting to a fitting for a lubrication point of a device to be lubricated, said fitting being arranged to removably connect to said connector to receive a lubricant from the connector, the fitting comprising:
a body in which a fluid conduit is formed for guiding the lubricant, when received from the connector via an inlet of the fluid conduit, into the lubrication point,
an integrated circuit configured to provide an identification code to identify the fitting, and
a first electrical contact for establishing an electrical path between the integrated circuit and a processor of the connector when a connection between the fitting and the connector is established,
wherein said body comprises a fixation end arranged to fasten the fitting into or onto the lubrication point,
wherein said integrated circuit is configured to transmit data via said first electrical contact to the processor, when the connection between the fitting and the connector is established, said data comprising said identification code,
the connector comprising:
the processor for receiving an identification code from the integrated circuit of the fitting when connected thereto, and
a second electrical contact for establishing an electrical path between the integrated circuit of the fitting and the processor via the first electrical contact of the fitting when the connection between the fitting and the connector is established,
wherein said processor comprises an electronic memory for storing said received identification code, or an identification of said fitting based on said received identification code, together with a timestamp to indicate when said fitting was mechanically and electrically coupled to the connector or together with further data received from a sensor in said fitting or in said connector,
wherein said processor is configured to store failed connection attempts in said memory together with a corresponding timestamp to indicate when said failed connection attempt took place.

2. The connector of claim 1, comprising a communication module for sending information to a server, and/or a display for displaying information to a user, and/or an alert generator for alerting the user in response to information,
wherein said information comprises data that is determined by the processor on the basis of the identification of the fitting.

3. The connector of claim 1, comprising a metering device for automatically dispensing an amount of the lubricant into the fitting, in which the amount of the lubricant is determined by the processor taking the identification of the fitting into account, and/or in which the metering device is arranged to measure the amount of the lubricant that is manually released by an operator into the fitting and providing the measured amount to the processor.

4. A lubrication device comprising the connector of claim 1, the connector being operably attached to or integrated in the lubrication device.

5. A lubricant dispenser system comprising at least one lubrication device in accordance with claim 4 and at least one fitting, said at least one fitting being removably connected to the connector.

6. The lubricant dispenser system according to claim 5, wherein the connector of said lubrication device and said fitting are configured to only establish said electrical path between the integrated circuit of the fitting and the processor of the connector when a mechanical coupling between the fitting and the connector is established.

7. The lubricant dispenser system according to claim 5, wherein the connector of said lubrication device and said fitting are configured to only permit said transmitting of said data to said processor when a mechanical coupling between the fitting and the connector is established.

8. The lubricant dispenser system according to claim 5, wherein said lubrication device is configured to only dispense the lubricant into said fitting when said identification code matches a predetermined criterion.

9. The lubricant dispenser system according to claim 5, wherein the connector of the lubrication device is configured in such a way that a correct coupling causes a part of the fitting to engage with an internal part of the connector wherein said engagement opens a flow path for the lubricant and disengagement closes said path.

10. A fitting for a lubrication point of a device to be lubricated, said fitting being removably connected to a connector to receive a lubricant from the connector, the fitting comprising:
a body in which a fluid conduit is formed for guiding the lubricant, when received from the connector via an inlet of the fluid conduit, into the lubrication point,
an integrated circuit configured to provide an identification code to identify the fitting, and
a first electrical contact for establishing an electrical path between the integrated circuit and a processor of the connector when a connection between the fitting and the connector is established,
wherein said body comprises a fixation end arranged to fasten the fitting into or onto the lubrication point,
wherein said integrated circuit is configured to transmit data via said first electrical contact to the processor, when the connection between the fitting and the connector is established, said data comprising said identification code.

11. The fitting of claim 10, wherein said integrated circuit comprises an electronic memory for storing said identification code.

12. The fitting of claim 10, wherein said integrated circuit is configured to generate said identification code in response to a challenge message received from the processor via said first electrical contact, when the connection between the fitting and the connector is established,
wherein said generated identification code is dependent on the received challenge message and wherein said identification code in combination with said challenge message allows the fitting to be uniquely identified by the processor.

13. The fitting of claim 10, wherein establishing said electrical path causes a power supply of said connector to be made available to the integrated circuit via the electrical path.

14. The fitting of claim 10, wherein said first electrical contact comprises at least two separate electrical conductors for connecting respectively, by contact, to at least two separate electrical conductors of the connector in order to establish said electrical path, each of said at least two separate electrical conductors of the fitting, separately, being operably connected to the integrated circuit.

15. The fitting of claim 14, wherein at least a part of said body is composed of a conductive material and forms one of said at least two separate electrical conductors of the fitting.

16. The fitting of claim 14, comprising a contact element that is fitted around a neck section of the body,
wherein at least one of said at least two separate electrical conductors is comprised in said contact element.

17. The fitting of claim 16, comprising a printed circuit board, said contact element being comprised in said printed circuit board, said integrated circuit being integrated in or mounted onto the printed circuit board.

18. The fitting of claim 10, wherein said integrated circuit comprises a sensor for determining a property of the lubricant in said fitting or in said device to be lubricated and/or of the device to be lubricated, when said fitting is installed in or on said lubrication point, and
wherein said integrated circuit is configured to communicatively connect said determined property to said processor of said connector when the connection between the fitting and the connector is established.

19. A printed circuit board device comprising a printed circuit board attached to the fitting of claim 10.

* * * * *